US008052472B2

(12) United States Patent
Uchida

(10) Patent No.: US 8,052,472 B2

(45) Date of Patent: Nov. 8, 2011

(54) SHIELD CONNECTOR MOUNTING STRUCTURE AND SHIELD CONNECTOR

(75) Inventor: Masashi Uchida, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 12/858,467

(22) Filed: Aug. 18, 2010

(65) Prior Publication Data

US 2011/0045693 A1 Feb. 24, 2011

(30) Foreign Application Priority Data

Aug. 21, 2009 (JP) ................................. 2009-191610

(51) Int. Cl.
*H01R 13/648* (2006.01)

(52) U.S. Cl. ................................... 439/607.28; 439/108

(58) Field of Classification Search .................... 439/92, 439/95, 98, 101, 108, 544, 548, 559, 564, 439/571–573, 607.01, 607.28, 607.3, 607.34
See application file for complete search history.

(56) References Cited

U.S. PATENT DOCUMENTS

| | | | | |
|---|---|---|---|---|
| 6,019,632 | A * | 2/2000 | Ozai et al. | 439/550 |
| 6,126,485 | A * | 10/2000 | Shobara et al. | 439/607.03 |
| 6,296,519 | B1 * | 10/2001 | Hashizawa et al. | 439/607.42 |
| 6,302,739 | B1 * | 10/2001 | Deno et al. | 439/607.17 |
| 7,044,781 | B2 * | 5/2006 | Goto | 439/559 |
| 7,048,586 | B2 * | 5/2006 | Ishizaki et al. | 439/607.44 |
| 7,097,498 | B2 * | 8/2006 | Miyazaki | 439/559 |

FOREIGN PATENT DOCUMENTS

JP 2008-41600 2/2008

* cited by examiner

*Primary Examiner* — Thanh Tam Le

(74) *Attorney, Agent, or Firm* — Gerald E. Hespos; Michael J. Porco

(57) ABSTRACT

A shield connector (40) includes a housing with a base (45) to be mounted into a metallic mating member. A connector fitting (51) is formed on a top side of the base (45) and a mounting projection (100) is formed on an under side of the base (45). A shield shell (140) is mounted between an inner tube (53) and an outer tube (54) of the connector fitting (51). A nut accommodating portion (110) is formed in the mounting projection (100) of the housing (41) and a nut 160 is mounted in the nut accommodating portion (110) to be freely movable in the longitudinal direction. A connecting portion (145) extends to close an opening of the nut accommodating portion (110) while being bent sideways at a rear end of the shield shell (140) in the longitudinal direction.

10 Claims, 12 Drawing Sheets

LONGITUDINAL DIRECTION 57 54A 54 54B B1 140 71 B1 51 53 55 63 83 45 105 C 110 C 141 47 47 120 41 100 104A 104B 160 106 107 145 27 21 27 61 65 65 81 85 33 20 23 24 31 32 34 25 22 37 P

SHIELD CONNECTOR MOUNTING STRUCTURE AND SHIELD CONNECTOR

BACKGROUND OF THE INVENTION

1. Field of the Invention

The invention relates to a shield connector to be mounted in a case of an electrical device and a shield connector mounting structure.

2. Description of the Related Art

Japanese Unexamined Patent Publication No. 2008-41600 discloses a shield connector including a shield shell. The connector is intended to supply power to a device such as a motor housed in a metallic case in an electric vehicle or the like. The shield shell is grounded to the metal case by bringing a spring piece on the shield shell into contact with the aluminum die-cast metallic case. However, the spring contact may not stabilize a contact load and, hence, improvement has been necessary. A seal ring provides sealing (watertightness) between the shield connector and the metallic case. Thus, a grounding structure needs to be revised to satisfy a desired sealing property.

The invention was developed in view of the above situation and an object thereof is to provide a shield connector and a shield connector mounting structure capable of satisfying both a sealing property and a grounding property.

SUMMARY OF THE INVENTION

The invention relates to a structure for mounting a shield connector into a conductive mating member formed with a mounting recess. The shield connector includes a housing with a base to be mounted into the mating member so that a surface of the base is in close contact with the mating member. A connector fitting portion projects from the base substantially in a longitudinal direction orthogonal to the base. A mounting projection projects from a side of the base substantially in the longitudinal direction and is at least partly fittable into the mounting recess. A seal is compressed in a direction orthogonal to the longitudinal direction. At least one terminal is mounted into a tube of the connector fitting portion. A tubular shield shell surrounds the terminal mounted in the tube of the connector fitting portion. At least one nut accommodating portion is formed by a recess in the mounting projection of the housing and opens in a facing surface substantially facing a wall of the mounting recess. At least one nut is mounted in the nut accommodating portion. A connecting portion extends to close the opening of the nut accommodating portion and at least partly overlaps the nut accommodated in the nut accommodating portion. The shield connector can be fixed to the mating member by bolt-fastening the base to a peripheral edge of the mounting recess from a first side. A bolt is inserted through the wall of the mounting recess and the connecting portion from a second side substantially opposite to the first side and is tightened into the nut for fastening the connecting portion to the wall of the mounting recess and grounding the shield shell to the mating member.

The connector fitting may have inner and outer tubes.

The shield shell preferably is mounted in a space between the inner and outer tubes of the connector fitting.

The nut preferably is mounted in the nut accommodating portion to be freely movable in the longitudinal direction.

The connecting portion preferably is bent sideways at a rear end portion of the shield shell substantially in the longitudinal direction.

The seal preferably is inserted between an outer peripheral wall of the mounting projection of the housing and an inner peripheral wall of the mounting recess while being compressed in a direction orthogonal to the longitudinal direction. Thus, the seal is held resiliently in contact with both peripheral walls.

According to the above, the connecting portion of the shield shell is bolt-fastened to the bottom wall of the mounting recess formed in the mating member. Thus, a contact load of the connecting portion on the bottom wall of the mounting recess can be increased more than that brought about by spring contact, and the connecting portion of the shield shell can be reliably brought into contact with the bottom wall of the mounting recess. Therefore, a highly reliable grounding structure is realized.

Further, bolts used for fixing the housing are fastened in a direction from the top side while the bolt used for grounding is fastened in a direction from the under side, wherefore a relationship of the directions of bolt fastening (bolt fastening directions) are in a reverse relationship. However, the nut as a mating partner of the bolt is so mounted in the nut accommodating portion as to be freely movable in the longitudinal direction (bolt fastening direction).

Thus, almost no force acts on the shield connector even if the bolt is tightened to ground the connecting portion of the shield shell. If the shield connector should be pushed in the longitudinal direction as the bolt is tightened, the bolt used to fix the shield connector might be loosened. However, in this construction, there is no such likelihood.

Further, according to the above, the seal ring is inserted between the outer peripheral wall of the mounting projection of the housing and the inner peripheral wall of the mounting recess while being compressed in the direction orthogonal to the longitudinal direction. With this arrangement, a direction of resilient deformation of the seal ring is in an orthogonal relationship to the bolt fastening direction (longitudinal direction). Thus, even if the connecting portion of the shield shell is bolt-fastened at a position very close to the seal ring, bolt fastening hardly affects a sealing property of the seal ring, thereby realizing a highly reliable sealing structure.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

A connector in accordance with the invention is described with reference to FIGS. 1 to 11. In the following description, a direction substantially orthogonal to a base 45 of a housing 41 (vertical direction in FIG. 2) is referred to as a longitudinal direction. Further, the upper side of the base 45 in FIG. 2 is called the top and the lower side thereof in FIG. 2 (side toward a device) is called an under side.

Figure 1:
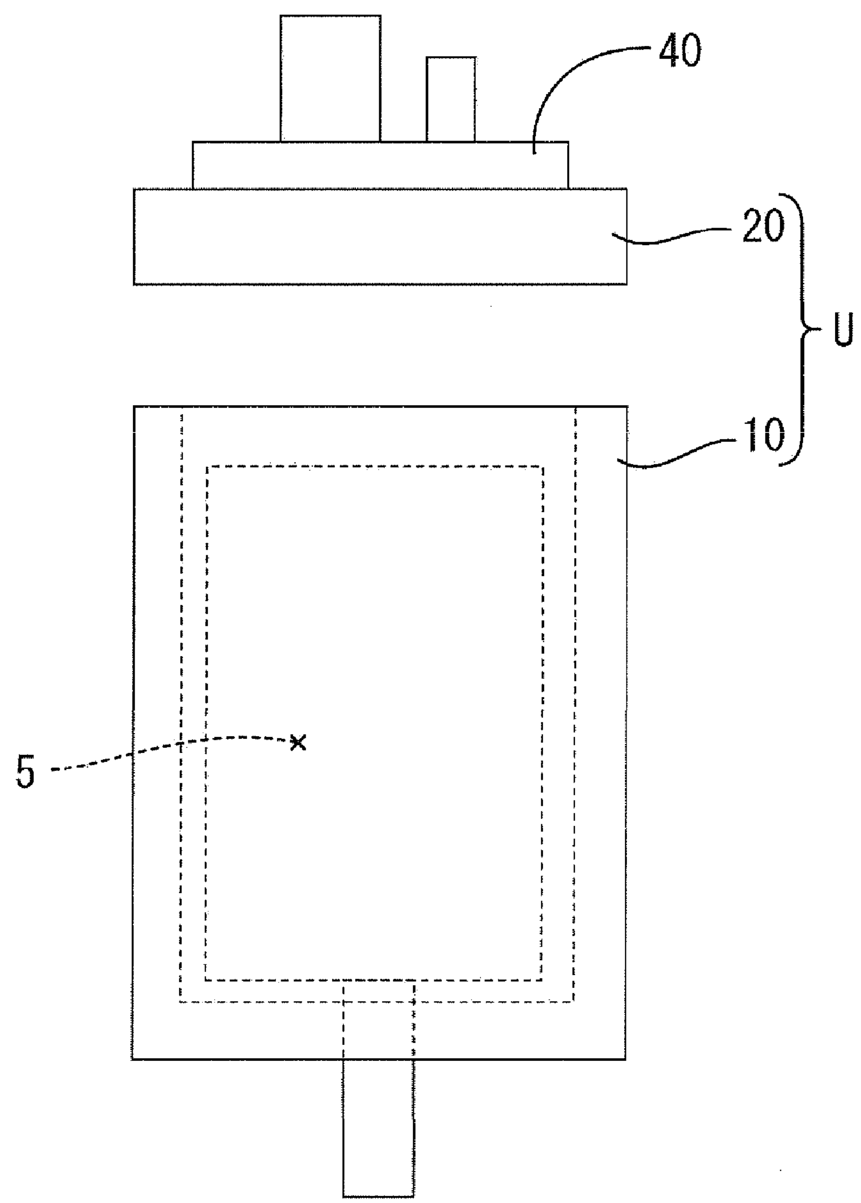
FIG. 1 is a diagram showing a metallic case according to one embodiment.

A conductive case U shown in FIG. 1 includes a metallic (e.g. aluminum die-cast, etc.) main body 10 and a metallic (e.g. aluminum die-cast, etc.) lid 20. An opening is formed in the upper surface of the main body 10, and a device (e.g. induction motor of an inverter type compressor in an automotive air conditioner) 5 can be accommodated in the opening. The opening of the main body 10 is closed by the lid 20, and the shield connector 40 is to mounted on the top side of the lid 20. Specifically, the lid 20 is formed with a mounting recess 21 and screw holes 27 adjacent to opposite sides of the mounting recess 21 in an upper surface of the lid 20 in FIG. 2. A mounting projection 100 of the shield connector 40 is inserted into the mounting recess 21 from an upper side in FIG. 1.

Figure 2:
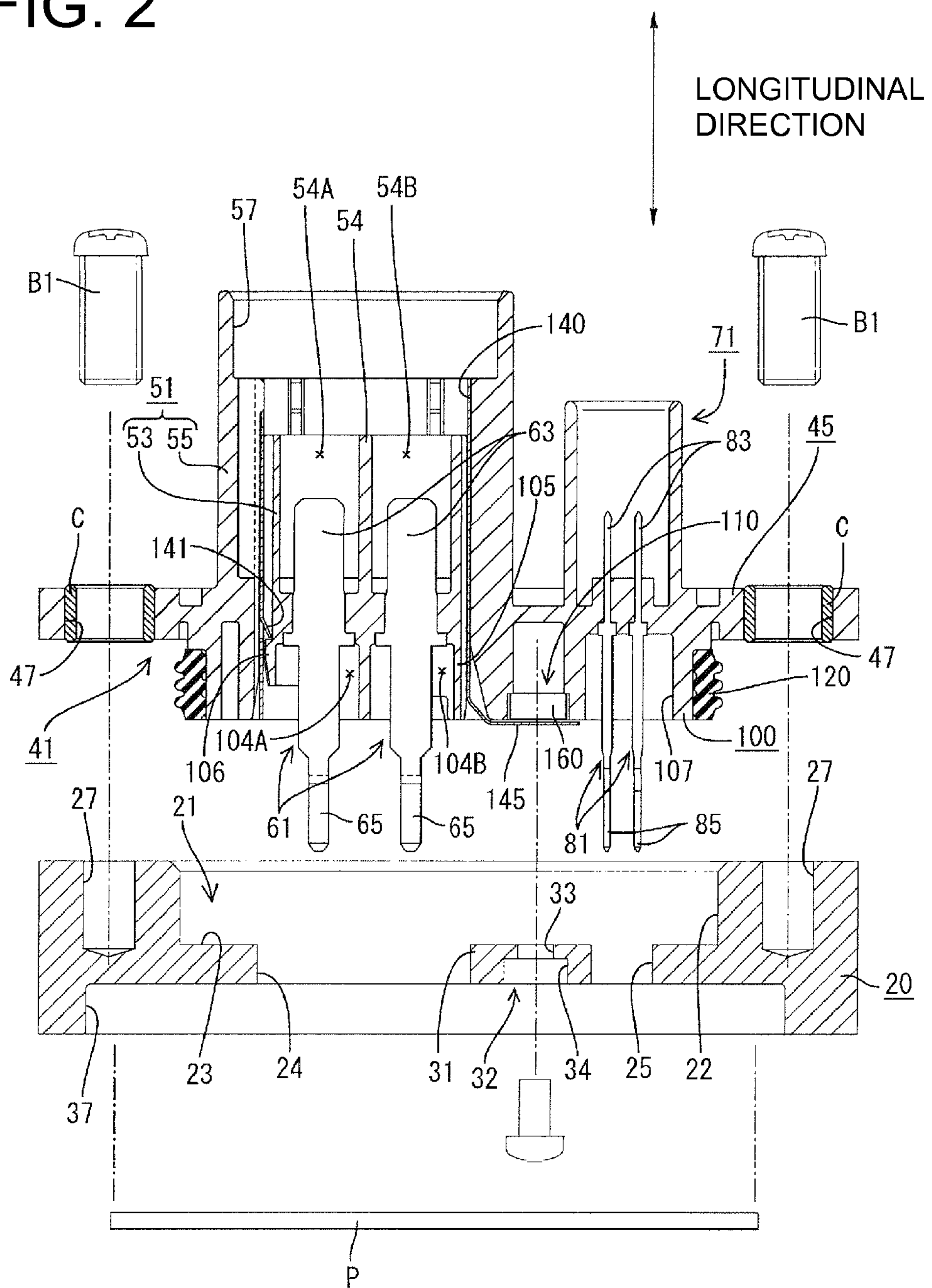
FIG. 2 is a section (showing an exploded state) showing a structure for mounting a shield connector into a lid member.

Left and right through holes 24, 25 are formed in a bottom wall 23 of the mounting recess 21 as shown in FIG. 2, and a seating surface 31 is provided adjacent to and between the through holes 24 and 25. The through holes 24, 25 can receive corresponding male terminals 61, 81 of the shield connector 40. The seating surface 31 is for grounding a shield shell 140 of the shield connector 40. An insertion hole 32 penetrates through the seating surface 31 and has an upper small diameter portion 33 and a lower large diameter portion 34. The lower portion 34 of the insertion hole 32 accommodates the head of a bolt and the upper portion 33 receives the neck of the bolt.

A board recess 37 is formed in the under side of the lid 20. The board recess 37 is below the mounting recess 21 and is slightly larger than the mounting recess 21. This board recess 37 enables a circuit board P to be mounted in the under side of the lid member 20 without touching the lid 20.

The shield connector 40 includes a housing 41, first male terminals 61, second male terminals 81, a seal ring 120, the shield shell 140 and a nut 160. The housing 41 is made e.g. of synthetic resin and includes the base 45. First and second connector fittings 51, 71 project upward from the top of the base 45 and the mounting projection 100 projects down at the under side of the base 45.

Figure 4:
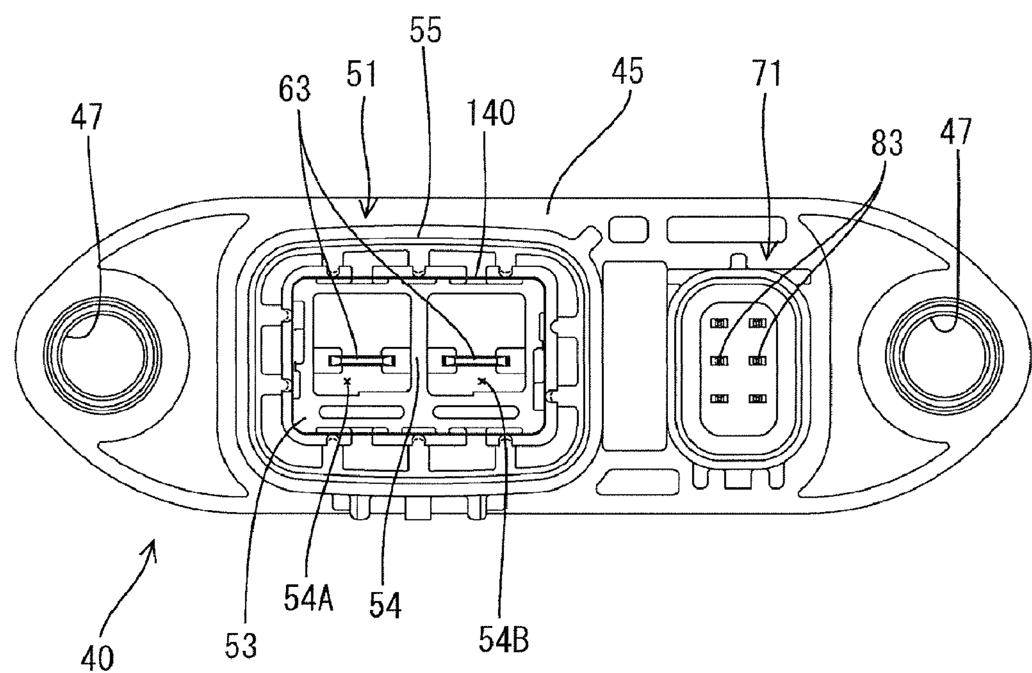
FIG. 4 is a plan view of the shield connector (shield connector of FIG. 3 is viewed from above).

The base 45 of the housing 41 is substantially flat and has a constant thickness. When viewed from above, the base 45 is wide as shown in FIG. 4. Bolt insertion holes 47 are formed at opposite left and right sides of this base 45 and align with the screw holes 27 of the lid 20. Metallic collars C are mounted inside the bolt insertion holes 47 and are somewhat thicker than the base 45.

The first and second connector fittings 51 and 71 are substantially side by side and are spaced apart by a specified distance, as shown in FIG. 2. The first connector fitting 51 is a double tube structure composed of an inner tube 53 and an outer tube 55. The interior of the inner tube 53 is partitioned into two terminal accommodating chambers 54A, 54B by a partition wall 54. A though hole vertically penetrates through the back wall of each terminal accommodating chamber 54, and the first male terminal 61 is press-fitted into the through hole from the lower side of FIG. 2 (under side).

The first male terminal 61 is formed by press-working a conductive plate and includes two tabs 63, 65. The tabs 63, 65 extend vertically and a stopper is formed at an intermediate part of the male terminal 61 as to project in a width direction. The first male terminal 61 is held at its front end position with the front tab 63 projecting into the inner tube 53 by the contact of the stopper with the edge of the insertion hole.

The rear tab 65 of the first male terminal 61 penetrates through the mounting projection 100 and projects back from the mounting projection 100. As shown in FIG. 2, the rear tab 65 has a tapered leading end and is soldered to a conductor path of the circuit board P after being inserted into a through hole (not shown) in the circuit board P.

The outer tube 55 is located radially outward of the inner tube 53 and projects more upward from the top surface of the base 45 than the inner tube 53. A uniform space is formed between the inner and outer tubes 53 and 55, and the shield shell 140 is mounted into the clearance.

The second connector fitting 71 has a single tube shape. The upper surface of the second connector fitting 71 defines a fitting opening for receiving a mating connector. Insertion holes vertically penetrate through the back wall of the second connector fitting 71, and the second male terminals 81 are press-fitted from the lower side in FIG. 2.

The second male terminal 81 is formed by press-working a conductive plate material similar to the first male terminal 61 and includes two tabs 83, 85. Both tabs 83, 84 extend substantially vertically and a stopper is formed at an intermediate part of the male terminal 81 to project in the width direction. The second male terminal 81 is held at its front end position with the front tab 83 projecting into the second connector fitting 71 by the contact of the stopper with the edge of the insertion hole.

The rear tab 85 of the second male terminal 81 also penetrates through the mounting projection 100 and projects back from the mounting projection 100 similar to the first male terminal 61. As shown in FIG. 2, the rear tab 85 has a tapered leading end and is soldered to a conductor path of the circuit board P after being inserted into a through hole (not shown) in the circuit board P.

Figure 3:
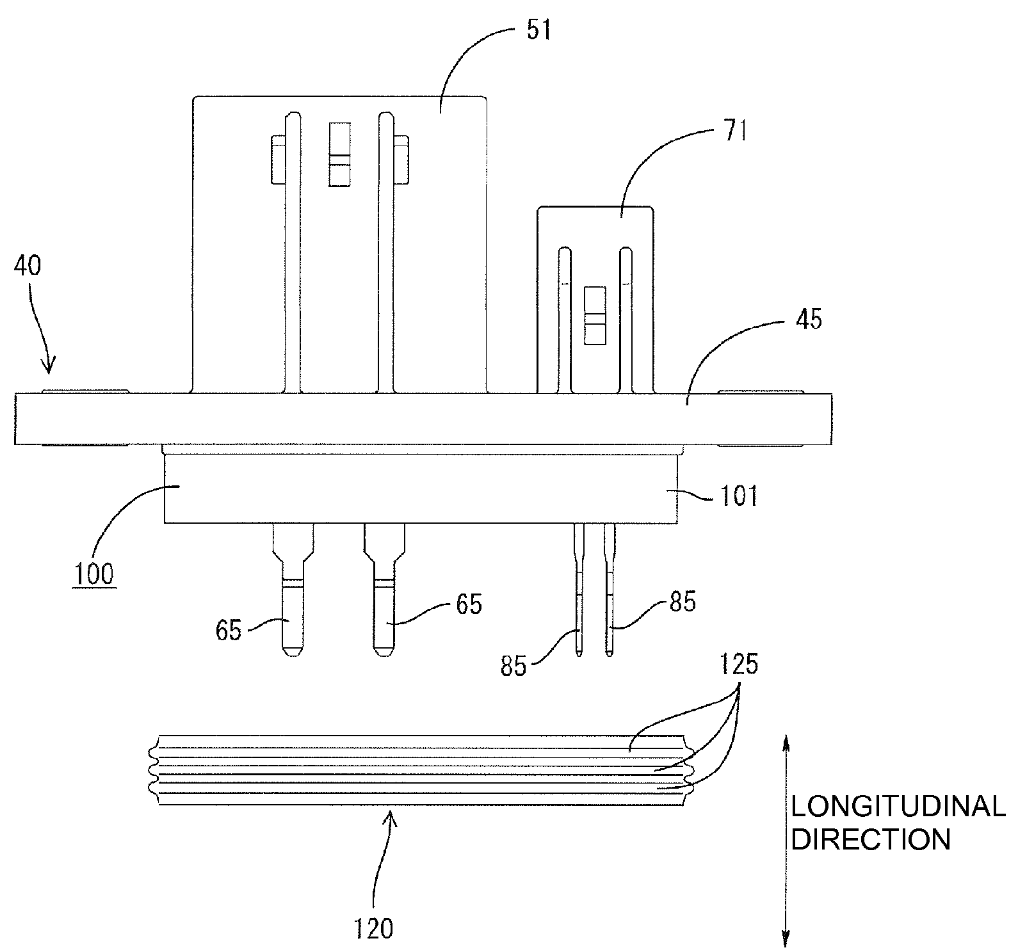
FIG. 3 is a front view of the shield connector (with a seal ring detached).
Figure 6:
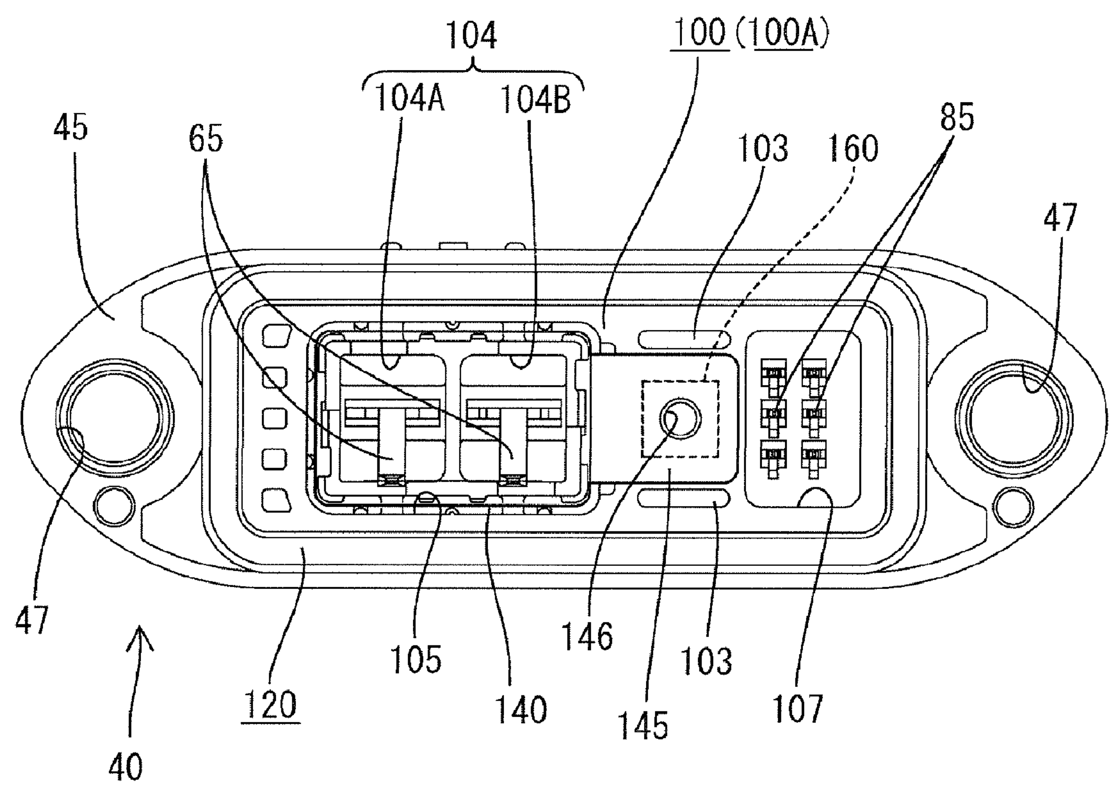
FIG. 6 is a bottom view of the shield connector (shield connector of FIG. 5 viewed from below).
Figure 7:
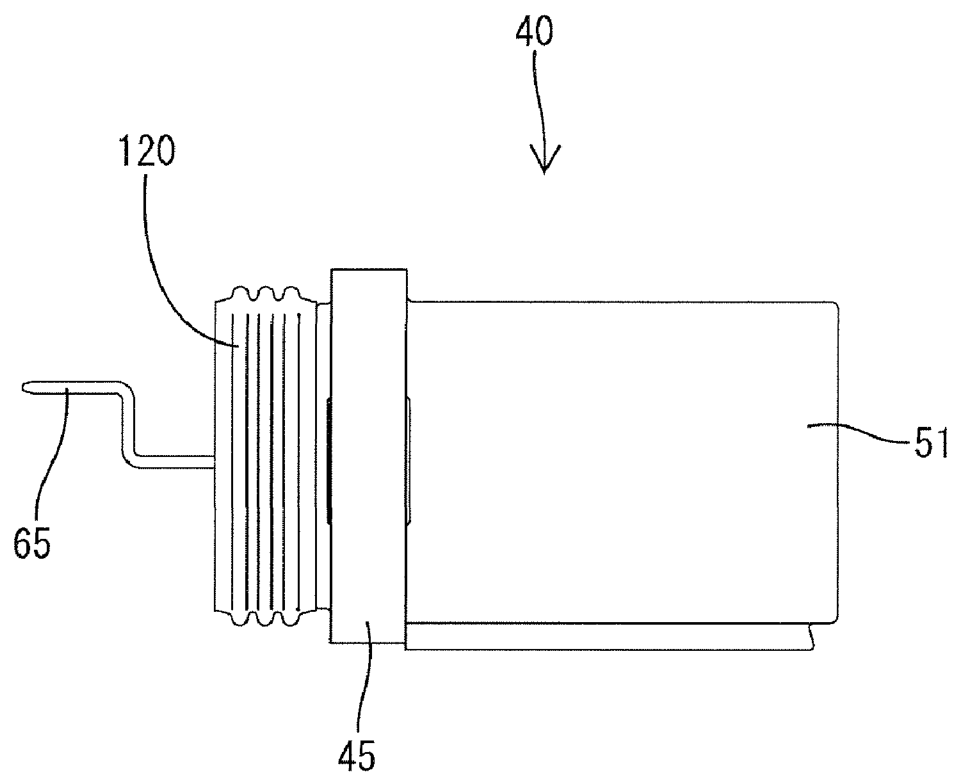
FIG. 7 is a side view of the shield connector.

The mounting projection 100 extends down in FIG. 3 from the under side of the base 45 and has a wide rectangular shape when viewed from below, as shown in FIG. 6. The mounting projection 100 is formed in an area overlapping both connector fittings 51, 71 formed on the top side.

The mounting projection 10 has left and right first lead-out holes 104 and a second lead-out hole 107. The left and right first lead-out holes 104A, 104B correspond to the terminal accommodating chambers 54A, 54B formed in the first connector fitting 51. Additionally, the first lead-out holes 104A, 104B extend down from the under surface of the base 45 and penetrate through the mounting projection 100 to form openings in a bottom end surface 100A of the mounting projection 100.

The rear tabs 65 of the first male terminals 61 are to be inserted through the first lead-out holes 104A, 104B and drawn out backward.

An annular insertion groove 105 surrounds both first lead-out holes 104, 104B. The insertion groove 105 penetrates through the base 45 and communicates with the outer tube 55 of the first connector fitting portion 51. The shield shell 140 is mounted in the insertion groove 105

The second lead-out hole 107 corresponds to the second connector fitting 71. This second lead-out hole 107 extends down from the under surface of the base 45 and penetrates the mounting projection 100 to open in the bottom end surface 100A of the mounting projection 100 similar to the first lead-out holes 104A, 104B. The rear tabs 85 of the second male terminals 81 are inserted through the second lead-out hole 107 and drawn out backward.

The mounting projection 100 is formed with the nut accommodating portion 110 at a position substantially between the first lead-out holes 104A, 104B and the second lead-out hole 107 (see FIG. 2). An escaping portion 117 is formed above the nut accommodating portion 110. The nut accommodating portion 110 opens in the bottom end surface 100A of the mounting projection 100, and accommodates the nut 160 therein.

Figure 8A:
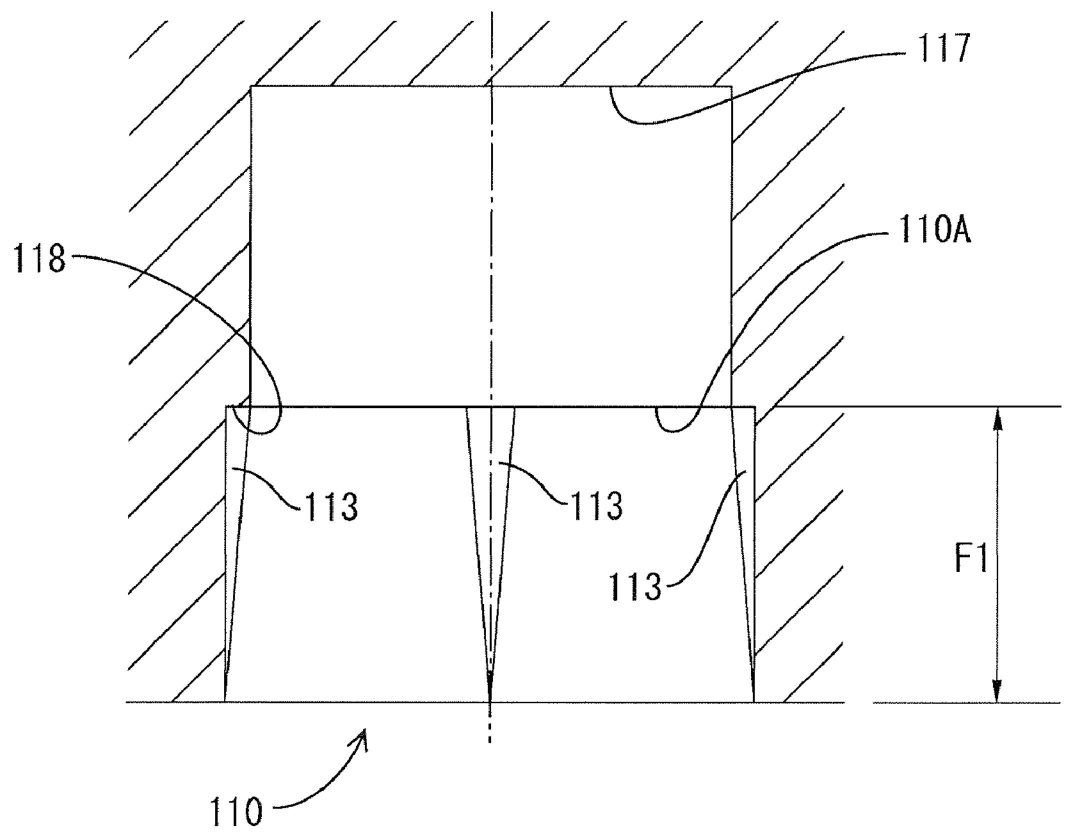
FIG. 8A is an enlarged view of a nut accommodating recess.
Figure 8B:
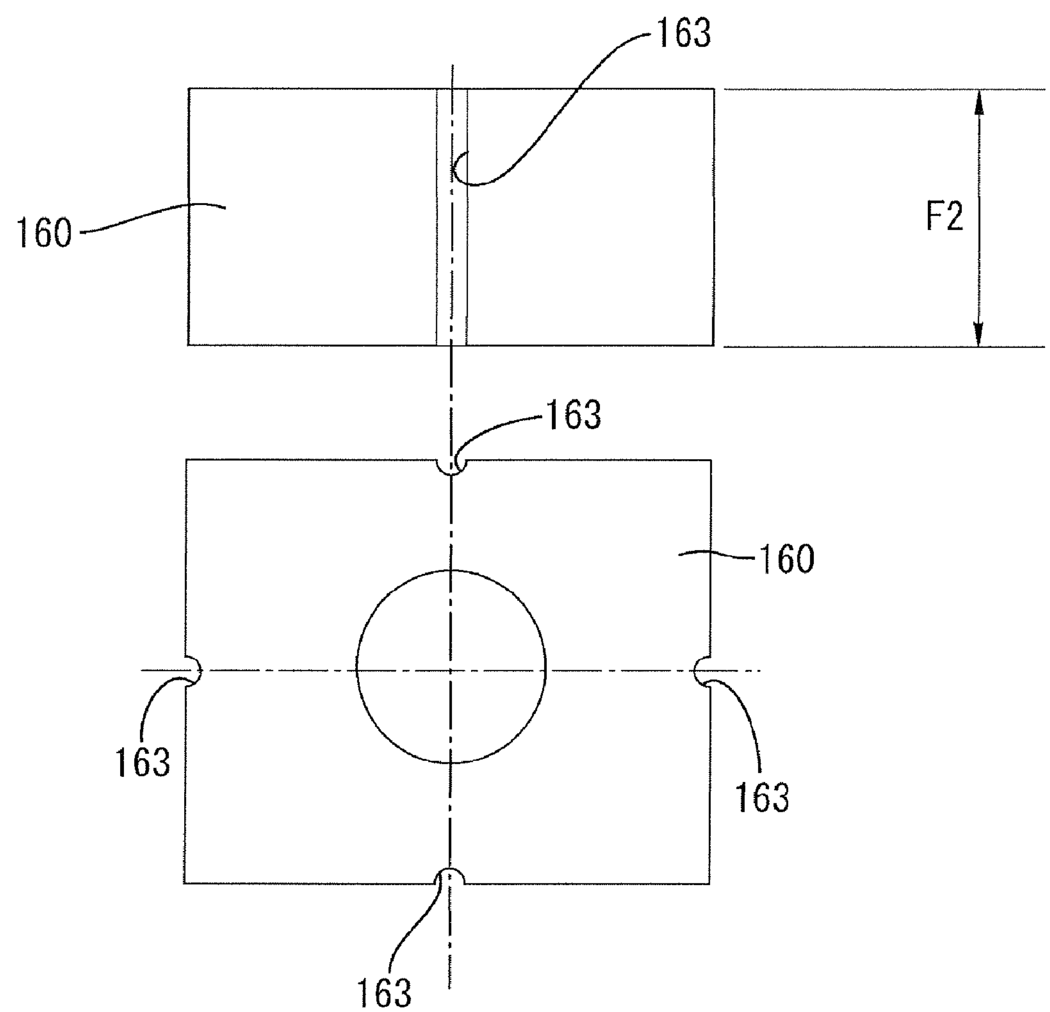
FIG. 8B is an enlarged view of a nut.

The shape of the nut accommodating portion 110 substantially conforms to the outer shape of the nut 160 to be accommodated therein, and the nut 160 is inserted with a minimum necessary clearance for fitting in the nut accommodating portion 110. A vertically extending rib 113 is formed on each inner wall of the nut accommodating portion 110 as shown in FIG. 8A. On the other hand, the peripheral wall of the nut 160 is formed with receiving grooves 163 corresponding to the ribs 113, as shown in FIG. 8B.

The ribs 113 receive the receiving grooves 163 to prevent rotation of the nut 160 accommodated in the nut accommodating portion 110. The depth F1 of the nut accommodating portion 110 exceeds the height F2 of the nut 160. Thus, there is some play between the accommodated nut 160 and a back end wall 110A of the nut accommodating portion 110, and the nut 160 is vertically freely movable in the nut accommodating portion 110 (see FIG. 11).

The ribs 113 formed on the surfaces of the nut accommodating portion 11 are tapered toward the opening side as shown in FIG. 8A. Thus, the contact of parts of the ribs 113 with the receiving grooves 163 of the nut 160 gives a weak force to the nut 160 to prevent the nut 160 from falling out of the nut accommodating portion 110.

The escaping portion 117 is slightly smaller than the nut accommodating portion 110 to form a step 118 between the escaping portion 117 and the nut accommodating portion 110. The escaping portion 117 communicates with the nut accommodating portion 110 and permits a bolt engaged with the nut 160 to escape.

Figure 5:
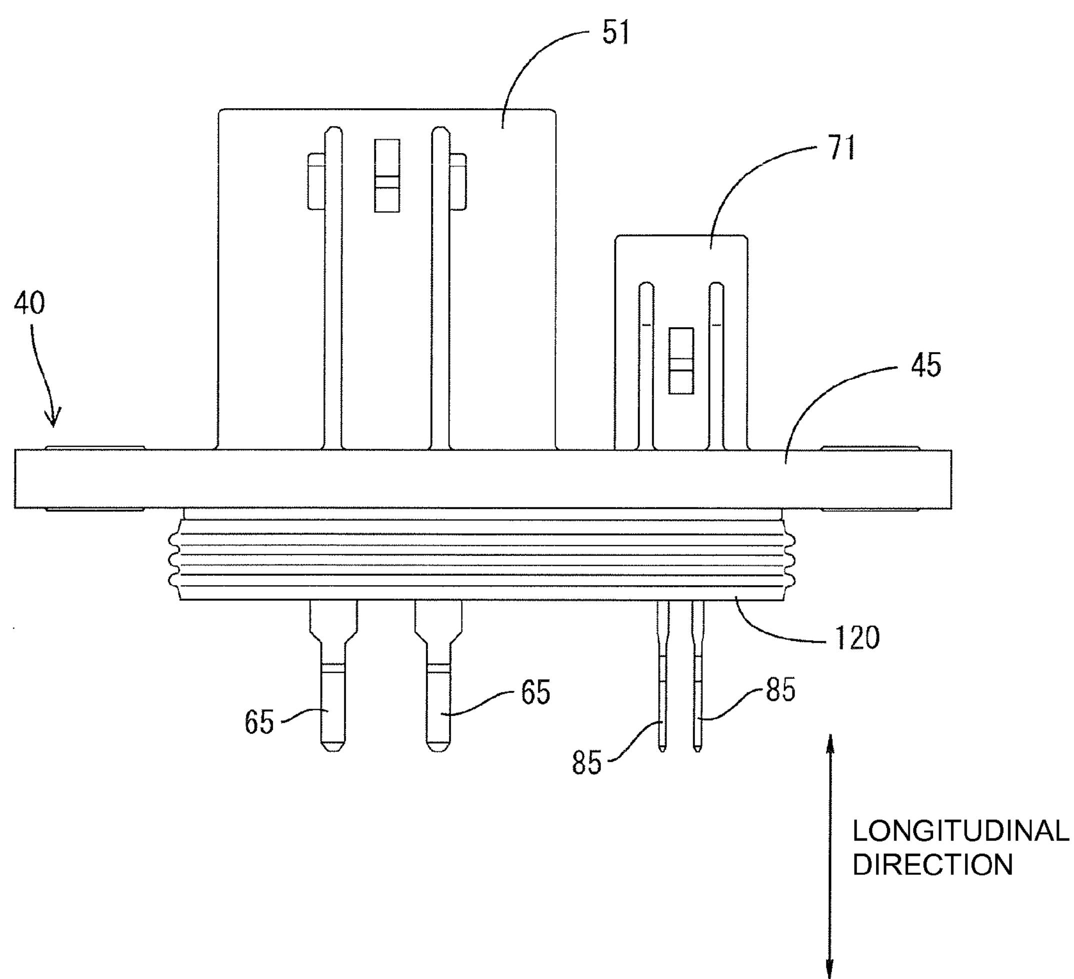
FIG. 5 is a front view of the shield connector (with the seal ring mounted).

The mounting projection 100 is to be fit into the mounting recess 21 of the lid 20. The seal ring 120 is to be mounted on an outer peripheral wall 101 of the mounting projection 100 (see FIG. 3) to completely seal between the lid 20 and the shield connector 40. The seal ring 120 is made of rubber or another resilient material and has a tubular shape with a vertically extending hollow part. As shown in FIGS. 3 and 5, the thickness of the seal ring 120 substantially equals the height of the mounting projection 100. Annular lips 125 are formed on the outer and inner circumferential surfaces of the seal ring 120.

The shield shell 140 is made of a conductive plate such as brass, heat-resistant copper alloy or the like. The shield shell 140 is a substantially rectangular tube with a cross section to substantially surround the inner tube 53 of the first connector fitting 51. The shield shell 140 is mounted into the housing 41 through the insertion groove 105 from the under side where the mounting projection 100 is formed.

A locking lance 141 is cantilevered inward on the shield shell 140 and the inner wall of the insertion groove 105 has a locking projection 106 corresponding to the locking lance 141. The shield shell 140 reaches a front stop position in the insertion groove 105 where it cannot be inserted any further and, simultaneously, the locking lance 141 engages the rear surface of the locking projection 106 to retain the shield shell 140.

At this front stop position, the upper end of the shield shell 140 projects from the upper end of the inner tube 53 of the first connector fitting 51 and substantially aligns with the bottom of a step 57 formed in the outer tube 55. Further, the bottom end of the shield shell 140 substantially aligns with the bottom end surface 100A of the mounting projection 100. Thus, the first male terminals (excluding parts drawn out from the mounting projection 100) 61 mounted in the first connector fitting 51 are surrounded by the shield shell 140.

The shield shell 140 is formed unitarily with a connecting portion 145. The connecting portion 145 is bent sideways (to the right in FIG. 2) at a rear end of the shield shell 140 in the longitudinal direction and extends horizontally. A taper 147 is formed at a base part of the bend.

As shown in FIG. 6, the connecting portion 145 is larger than the nut accommodating portion 110 and is placed on the lower surface of the nut 160 accommodated in the nut accommodating portion 110 to close the nut accommodating portion 110. The connecting portion 145 is formed with an insertion hole 146 aligned with a shaft hole of the nut 160, as shown in FIG. 6.

The bottom end surface 100A of the mounting projection 100 has guiding portions 103 at the opposite sides of the connecting portion 145 to restrict the position of the connecting portion 145.

The shield connector 40 is mounted into the lid 20 by arranging the shield connector 40 to face the lid 20 as shown in FIG. 2. The mounting projection 100 of the shield connector 40 then is inserted into the mounting recess 21 of the lid 20. The mounting bolts B1 then are inserted through the bolt insertion holes 47 of the shield connector 40 and screwed into the screw holes 27 of the lid 20. In this way, the base 45 is fastened closely to a peripheral edge of the mounting recess 21 formed in the lid 20 and the shield connector 40 is fixed to the lid 20.

At this time, the seal ring 120 of the shield connector 40 is squeezed between the outer peripheral wall 101 of the mounting projection 100 and an inner peripheral wall 22 of the mounting recess 21 to be compressed substantially in a horizontal direction T. This resiliently brings the lips 125 of the seal ring 120 into contact with the outer peripheral wall 101 of the mounting projection 100 and the inner peripheral wall 22 of the mounting recess 21. Thus, mating parts of the shield connector 40 and the lid 20 are sealed completely over the entire periphery.

Figure 9:
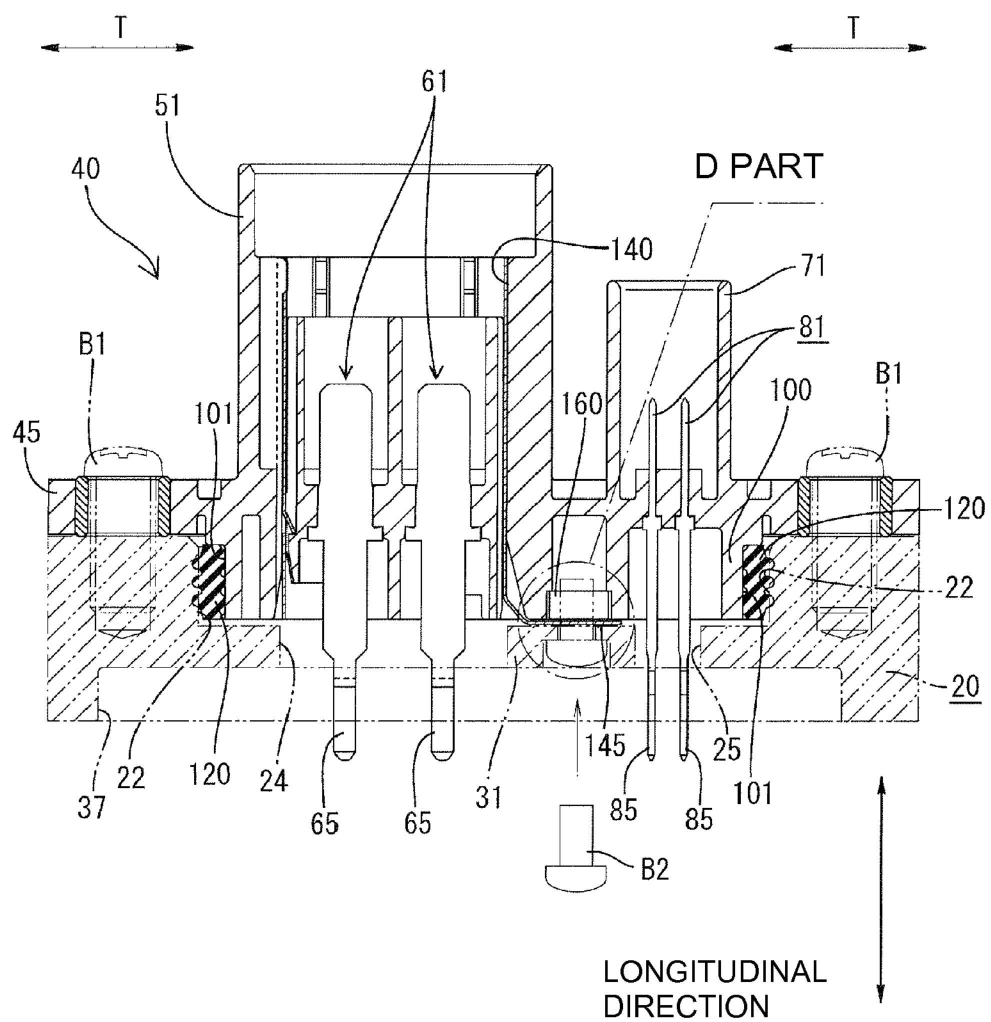
FIG. 9 is a diagram showing a mounting procedure of the shield connector into the lid member.

The connecting portion 145 of the shield shell 140 is placed on the upper surface of the seating surface portion 31 of the lid 20 with the shield connector 40 fixed to the lid 20. A grounding bolt B2 then is inserted through the insertion holes 32, 146 of the seating surface 31 and the connecting portion 145 from the under side of the lid 20, as shown in FIG. 9, and is screwed into the nut 160 accommodated in the nut accommodating portion 110. In this way, the connecting portion 145 of the shield shell 140 is bolt-fastened to the seating surface portion 31 of the lid 20 to complete grounding.

Figure 10:
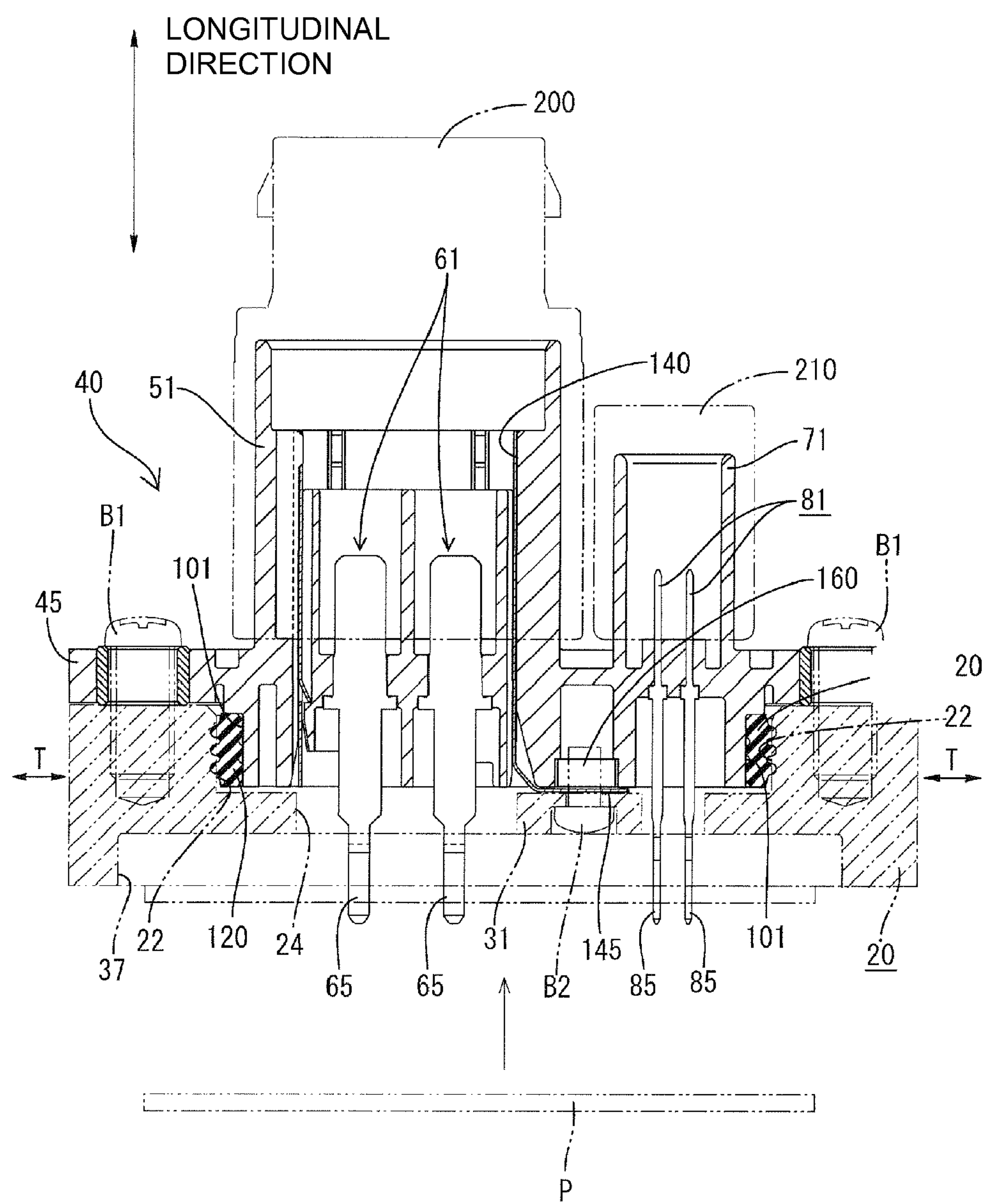
FIG. 10 is a diagram showing the mounting procedure of the shield connector into the lid member.
Figure 11:
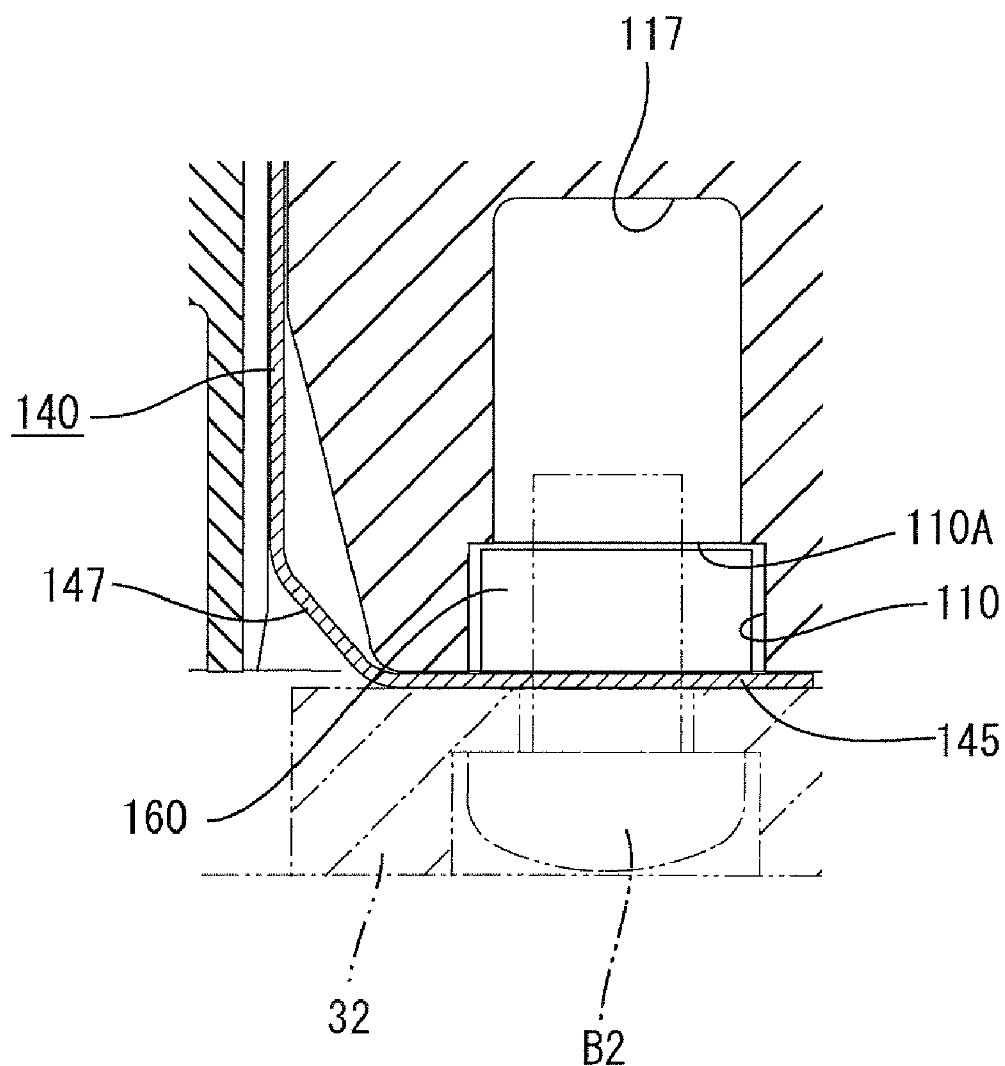
FIG. 11 is a diagram enlargedly showing a D part of FIG. 9.

The circuit board P is fixed after the grounding bolt B2 is tightened. To this end, the circuit board P may be brought toward the lid 20 from the under side, as shown in FIG. 10. Then, the circuit board P and the lid 20 are positioned so that the tab pieces 65, 85 of the respective male terminals 61, 81 of the shield connector 40 drawn out from the under side of the lid 20 through the through holes 24, 25 are fitted into the through holes in the circuit board P. The tab pieces 65, 85 then are connected electrically (e.g. soldered) to the circuit board P to complete the mounting of the shield connector 40 into the lid 20.

After the shield connector 40 is mounted, the lid 20 is mounted into the conductive (metallic) case main body 10 to close the opening by unillustrated mounting means. A first connector 200 connected to a power supply is fit into the first connector fitting portion 51 of the shield connector 40 and a second connector 210 connected with a signal line is fit into the second connector fitting portion 71. In this way, power is supplied to the device housed in the case main body 10 and various control signals for controlling the device can be input.

The first connector 200 is a shield connector and includes a tubular shield shell (not shown) similar to the shield shell 140 provided in the first connector fitting portion 51. The shield shell of such a first connector 200 is connected with a braided wire or outer conductor of a power supply cable (shielded cable) and contacts the shield shell 140 of the shield connector 40 at the time of connecting the connectors. In this way, the braided wire of the power supply cable (shielded cable) and the shield shell of the second connector 200 are grounded to the lid 20 together with the shield shell 140 of the shield connector 40.

The connecting portion 145 of the shield connector 40 is bolt-fastened to the seating surface portion 31 of the lid 20. Thus, a contact load between the connecting portion 145 and the seating surface portion 31 can be increased more than that brought about by spring contact. Thus, the connecting portion 145 is held reliably in contact with the seating surface portion 31 of the lid 20 to establish a highly reliably grounding structure. If the connecting portion 145 is held in contact with the lid 20 using a spring, the contact load may decrease as the spring deteriorates with time. However, with bolt fastening, a possibility of reducing the contact load is drastically smaller and the grounding structure is highly reliable.

The bolts B1 used for fixing the housing are fastened from the top while the bolt B2 used for grounding is fastened from the under side. Therefore the bolt fastening directions preferably are in a substantially reverse relationship. However, the nut 160 as a mating partner of the bolt B2 is mounted in the nut accommodating portion 110 to be freely movable in the longitudinal direction. Thus, almost no force acts on the shield connector 40 when the bolt B2 is tightened. If the shield connector 40 should be pushed up as the bolt B2 is tightened, the bolts B1 bolt-fastening the shield connector 40 might be loosened. However, in this embodiment, there is no such likelihood.

The seal ring 120 is mounted on the outer peripheral wall of the mounting projection 100 formed on the housing 41 and resiliently deforms in the horizontal direction to provide sealing. In other words, the bolt B2 is fastened substantially in the vertical direction, whereas the seal ring 120 resiliently deforms in the horizontal direction. The directions are orthogonal. Thus, a highly reliable sealing structure is realized.

The seal ring 120 seals between the mating parts of the shield connector 40 and the lid 20 over substantially the entire circumference and a degree of resilient deformation is uniform over the substantially entire circumference. Here, the grounding by the connecting portion 145 needs to be set within a fluid- or waterproof part (inside the seal ring 120). Thus, the bolt B2 for bolt-fastening the connecting portion 145 to the seating surface portion 31 has to be positioned in proximity to the seal ring 120.

If the direction of resilient deformation of the seal ring 120 and the fastening direction of the bolt B2 are same, only a part of the seal ring 120 close to the bolt B2 is strongly fastened to increase the degree of resilient deformation, thereby making the degree of resilient deformation of the seal ring 120 non-uniform. However, the fastening direction of the bolt B2 and the direction of resilient deformation of the seal ring 120 are in the orthogonal direction T in this embodiment. Thus, the fastening of the bolt B2 does not affect the degree of resilient deformation of the seal ring 120 at all. Thus, the degree of resilient deformation of the seal ring 120 is substantially uniform over the entire periphery to achieve a highly reliable sealing structure. As described above, it is possible to realize both the highly reliable sealing structure and the highly reliable grounding structure on the premise that the grounding by the connecting portion 145 is set in the waterproof part (inside the seal ring 120).

Further, the connecting portion 145 is guided by the guides 103 on the bottom end surface 100A of the mounting projection 100. Thus, a displacement of the connecting portion 145 resulting from tightening the bolt B2 is prevented.

The invention is not limited to the above described and illustrated embodiment. For example, the following embodiment is also included in the technical scope of the present invention.

Although the lid 20 of the metallic case U for housing the device is illustrated as an example of the mating member in the above embodiment, the mating member is not limited to a lid and may be a part of the case main body 10.

What is claimed is:

1. A structure for mounting a shield connector into a conductive mating member formed with a mounting recess, the shield connector comprising:

a housing with a base mounted into the mating member and being bolt-fastened to a peripheral edge of the mounting recess from the a first side so that a surface of the base closely contacts the mating member, a connector fitting projecting from the base in a longitudinal direction orthogonal to the base, and a mounting projection projecting from a side of the base substantially in the longitudinal direction and fittable into the mounting recess;

a seal to be compressed in a direction orthogonal to the longitudinal direction;

at least one terminal mounted into a tube of the connector fitting;

at least one nut accommodating portion recessed in the mounting projection of the housing and opening in a surface facing a wall of the mounting recess;

at least one nut mounted in the nut accommodating portion; and a tubular shield shell mounted to surround the terminal mounted in the tube of the connector fitting, a connecting portion at least partly closing the opening of the nut accommodating portion and overlapping the nut; and a bolt inserted through the wall of the mounting recess and the connecting portion from a second side substantially opposite to the first side and tightened into the nut for fastening the shield shell of the shield connector having the connecting portion to the wall of the mounting recess and grounding to the mating member.

2. The structure of claim 1, wherein the tube is an inner tube and wherein the connector fitting portion further has an outer tube.

3. The structure of claim 2, wherein the shield shell is mounted in a space between the inner tube and the outer tube of the connector fitting portion.

4. The structure of claim 1, wherein the at least one nut is mounted in the nut accommodating portion to be freely movable in the longitudinal direction.

5. The structure of claim 1, wherein the connecting portion is bent sideways at a rear end of the shield shell substantially in the longitudinal direction.

6. The structure of claim 1, wherein the seal is inserted between an outer peripheral wall of the mounting projection of the housing and an inner peripheral wall of the mounting recess while being compressed in a direction orthogonal to the longitudinal direction and held resiliently in contact with the peripheral walls.

7. A shield connector to be mounted into a conductive mating member formed with a mounting recess, comprising:

a housing with a base mounted into the mating member so that a surface of the base closely contacts the mating member, a connector fitting projecting from the base substantially in a longitudinal direction orthogonal to the base, and a mounting projection projecting from a side of the base portion substantially in the longitudinal direction and being fit into the mounting recess, at least one nut accommodating portion recessed in a surface of the mounting projection of the housing and facing a wall of the mounting recess, at least one nut mounted in the nut accommodating portion;

at least one terminal mounted into a tube of the connector fitting;

a tubular shield shell surrounding the terminal mounted in the tube of the connector fitting;

a connecting portion extending to close the opening of the nut accommodating portion and at least partly overlap with the nut accommodated in the nut accommodating portion.

8. The shield connector of claim 7, wherein the tube is an inner tube portion and the connector fitting portion further having an outer tube portion, the shield shell being mounted in a space between the inner tube and the outer tube of the connector fitting.

9. The shield connector of claim 8, wherein the nut is mounted in the nut accommodating portion to be freely movable in the longitudinal direction, and the connecting portion is bent sideways at a rear end portion of the shield shell substantially in the longitudinal direction.

10. The shield connector of claim 7, further comprising a seal between an outer peripheral wall of the mounting projection of the housing and an inner peripheral wall of the mounting recess while being compressed in a direction orthogonal to the longitudinal direction, thereby being resiliently held in contact with the both peripheral walls.

* * * * *